US008912062B2

(12) United States Patent
Takeshita

(10) Patent No.: US 8,912,062 B2
(45) Date of Patent: Dec. 16, 2014

(54) SEMICONDUCTOR STORAGE DEVICE AND METHOD OF MANUFACTURING SAME

(75) Inventor: Toshiaki Takeshita, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 351 days.

(21) Appl. No.: 13/551,240

(22) Filed: Jul. 17, 2012

(65) Prior Publication Data

US 2012/0329223 A1 Dec. 27, 2012

Related U.S. Application Data

(62) Division of application No. 12/761,149, filed on Apr. 15, 2010, now Pat. No. 8,247,858.

(30) Foreign Application Priority Data

Apr. 16, 2009 (JP) ................. 2009-100055

(51) Int. Cl.
H01L 21/336 (2006.01)
H01L 29/792 (2006.01)
H01L 27/115 (2006.01)
H01L 21/28 (2006.01)
H01L 29/423 (2006.01)
H01L 29/66 (2006.01)

(52) U.S. Cl.
CPC .... H01L 27/11568 (2013.01); H01L 21/28282 (2013.01); H01L 27/11565 (2013.01); H01L 29/42344 (2013.01); H01L 29/66833 (2013.01); H01L 29/792 (2013.01)
USPC ....................................... 438/267

(58) Field of Classification Search
USPC .......... 438/197, 257, 261, 266, 267; 257/314, 257/324, 326, 365; 365/185.1, 185.26
See application file for complete search history.

(56) References Cited

U.S. PATENT DOCUMENTS

| 5,427,968 | A | 6/1995 | Hong |
| 5,510,639 | A | 4/1996 | Okuda et al. |
| 5,950,087 | A * | 9/1999 | Hsieh et al. ............ 438/264 |
| 6,157,060 | A * | 12/2000 | Kerber ................ 257/316 |
| 6,204,126 | B1 | 3/2001 | Hsieh et al. |
| 6,477,088 | B2 | 11/2002 | Ogura et al. |
| 6,479,859 | B2 | 11/2002 | Hsieh et al. |
| 6,518,123 | B2 * | 2/2003 | Lin ................. 438/257 |
| 6,624,028 | B1 * | 9/2003 | Wen ................ 438/267 |
| 6,735,118 | B2 | 5/2004 | Ogura et al. |

(Continued)

FOREIGN PATENT DOCUMENTS

JP 2002-231829 A 8/2002
JP 2002-289711 A 10/2002

Primary Examiner — Evan Pert
(74) Attorney, Agent, or Firm — Sughrue Mion, PLLC

(57) ABSTRACT

In a semiconductor storage device a select gate electrode is arranged into a ring shape so as to surround the second impurity regions, and is electrically connected to a word line. A first control gate electrode is arranged into a ring shape on the outer peripheral side of the select gate electrode, and a second control gate electrode is arranged into a ring shape on the inner peripheral side of the select gate electrode. A pair of first and second bit lines corresponding to every row are placed on the memory cells of the device, a first bit line is electrically connected to one of first impurity regions that are adjacent along the row direction, and a second bit line is electrically connected to the other of the first impurity regions that are adjacent along the row direction.

2 Claims, 11 Drawing Sheets

(56) References Cited

U.S. PATENT DOCUMENTS

| | | |
|---|---|---|
| 6,746,920 B1 * | 6/2004 | Wen et al. ............... 438/257 |
| 6,803,620 B2 | 10/2004 | Moriya et al. |
| 6,858,497 B2 | 2/2005 | Moriya et al. |
| 7,352,033 B2 | 4/2008 | Satoh et al. |
| 2002/0067641 A1 | 6/2002 | Ogura et al. |
| 2002/0192908 A1 * | 12/2002 | Lin ............... 438/257 |
| 2003/0166319 A1 * | 9/2003 | Wen ............... 438/257 |
| 2004/0087087 A1 | 5/2004 | Ogura et al. |
| 2004/0219751 A1 | 11/2004 | Satoh et al. |

* cited by examiner

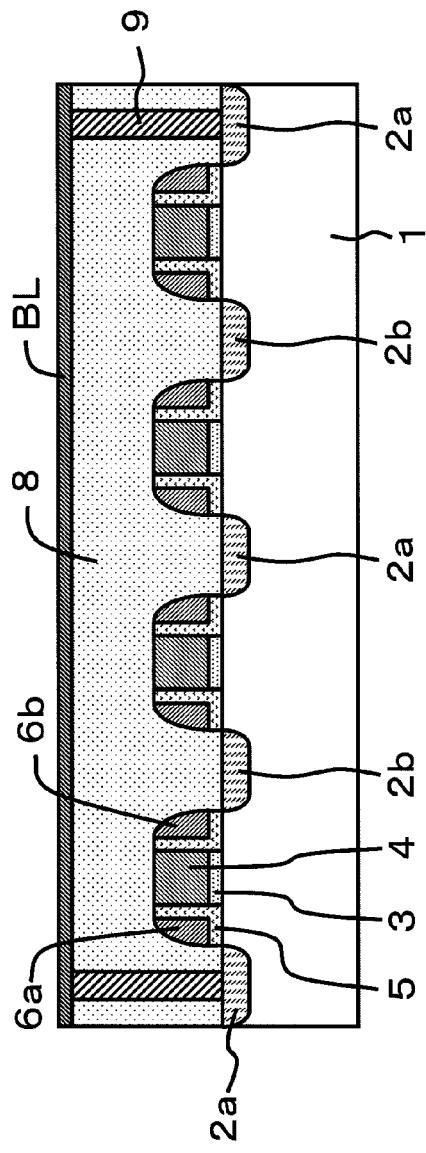
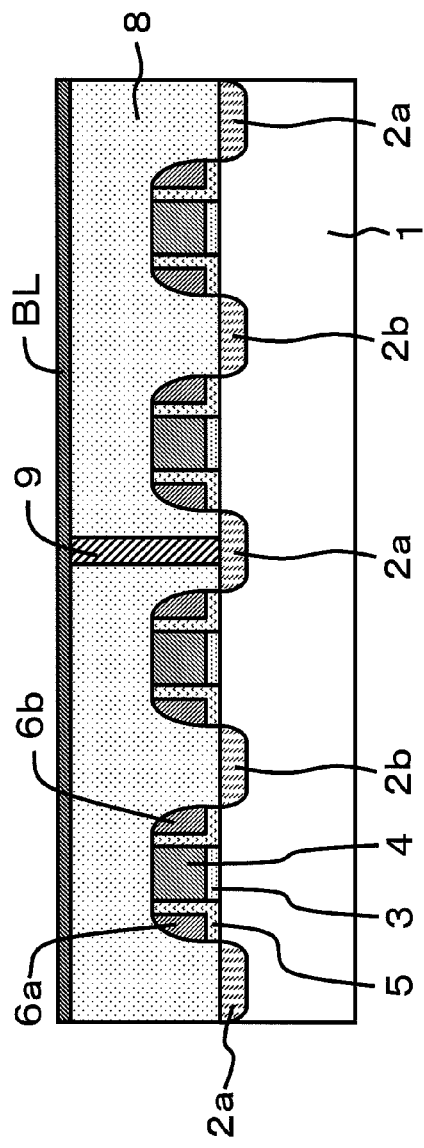

SEMICONDUCTOR STORAGE DEVICE AND METHOD OF MANUFACTURING SAME

CROSS REFERENCE TO RELATED APPLICATIONS

This application is a divisional of U.S. patent application Ser. No. 12/761,149, filed Apr. 15, 2010, claiming priority based on Japanese Patent Application No. 2009-100055, filed Apr. 16, 2009, the contents of all of which are incorporated herein by reference in their entirety.

TECHNICAL FIELD

Reference to Related Application

The present invention is based upon and claims the benefit of the priority of Japanese patent application No. 2009-100055 filed on Apr. 16, 2009, the disclosure of which is incorporated herein in its entirety by reference thereto.

This invention relates to a semiconductor storage device having a split-gate non-volatile memory, and to a method of manufacturing this semiconductor storage device.

BACKGROUND

Semiconductor storage devices having a split-gate non-volatile memory include those having a memory cell in which a pair of impurity regions 102a, 102b are formed in the main surface of a substrate 101 with a channel region interposed between them, a select gate electrode 104 is formed on the channel region via a gate insulating film 103, and sidewall-shaped control gate electrodes 106a, 106b are formed on both side faces of the select gate electrode 104 and on the surface of the channel region (the channel region in the area between the impurity regions 102a, 102b and select gate electrode 104) via a gate-isolation insulating film 105 (e.g., ONO film) (see FIGS. 6, 7, 9 and 10, for example, see Patent Documents 1 and 2). If this cell is selected by supplying the select gate electrode 104 with a prescribed potential in this semiconductor storage device, controlling the potential supplied to the impurity regions 102a, 102b and control gate electrodes 106a, 106b enables electric charge to be stored in and written to the gate-isolation insulating film 105 underlying the control gate electrodes 106a, 106b, to be read out and to be expelled and erased from the gate-isolation insulating film 105.

As illustrated in FIG. 8, a circuit in which such memory cells are arrayed is such that one impurity region of the cell is connected to a bit line driver (not shown) via a bit line (BL1, BL2, BL3, BL4), the other impurity region of the memory cell is connected to ground (GND) via a common source line (CS), one control gate electrode of the memory cell (the control gate electrode on the side of that impurity region connected to the common source line) is connected to a control gate driver (not shown) via wiring (CG1, CG2), the other control gate electrode of the memory cell (the control gate electrode on the side of that impurity region connected to the bit line) is connected to ground via wiring, and the select gate electrode of the memory cell is connected to a word line driver (not shown) via a word line (WL1, WL2, WL3, WL4). The bit line (BL1, BL2, BL3, BL4) is connected to the one impurity region of each of the memory cells arrayed in the direction of the corresponding row and is connected to the common impurity regions of mutually adjacent memory cells. The common source line (CS) is connected to the other impurity region of each of the memory cells irrespective of the row and column directions and is connected to the common impurity regions of mutually adjacent memory cells. The word line (WL1, WL2) is connected to the select gate electrode of each of the memory cells arrayed in the column direction. The control gate electrodes placed on both sides of the impurity region connected to the common source line (CS) are at a common potential owing to control of the control gate driver (not shown). The control gate electrodes placed on both sides of the impurity region connected to the bit line (BL1, BL2, BL3, BL4) are at the common ground potential. For example, in order to select the selected cell enclosed by the dotted line in FIG. 8, the bit line BL2 and word line WL3 are selected by the bit line driver (not shown) and word line driver (not shown), respectively.

This semiconductor storage device is such that a semiconductor storage device similar to that shown in FIG. 7 is manufactured by forming the select gate electrode 104 on the channel region of substrate 101 via the gate insulating film 103 (see FIG. 9A); forming the gate-isolation insulating film 105 on the surface of substrate 101 inclusive of the select gate electrode 104 (see FIG. 9B); forming a silicon layer 106 on the surface of the gate-isolation insulating film 105 (see FIG. 9C); forming the sidewall-shaped control gate electrodes 106a, 106b by etching back (by anisotropic etching) the silicon layer 106 (see FIG. 10A); forming the pair of impurity regions 102a, 102b on both sides of the channel region of substrate 101 in self-aligning fashion (see FIG. 10B); and exposing the surfaces of the select gate electrode 104 and impurity regions 102a, 102b by removing the gate-isolation insulating film 105 on the select gate electrode 104 and impurity regions 102a, 102b (see FIG. 10C).

[Patent Document 1]
Japanese Patent Kokai Publication No. JP2002-231829A
[Patent Document 2]
Japanese Patent Kokai Publication No. JP2002-289711A

SUMMARY

The entire disclosures of the above-mentioned Patent Documents 1 and 2 are incorporated herein by reference thereto. An analysis by the present disclosure will be given below.

With the above arrangement in which surfaces of the gate-isolation insulating film 105 and impurity regions 102a, 102b are in the exposed state (see FIG. 10C), the control gate electrodes 106a, 106b are connected into a single electrode surrounding the select gate electrode 104, as illustrated in FIG. 11A, and therefore separate potentials cannot be applied to the control gate electrodes 106a, 106b on both sides of the select gate electrode 104. Consequently, in order to arrange it so that separate potentials can be applied to the control gate electrodes 106a, 106b on both sides of the select gate electrode 104 in the conventional art, a resist 107 having openings 107a in areas at both ends of the select gate electrode 104 in terms of the longitudinal direction thereof is formed by photolithography, as illustrated in FIG. 11B, and the control gate electrodes 106a, 106b to be exposed are etched using the resist 107 as a mask, thereby separating the control gate electrodes 106a, 106b from each other, as illustrated in FIG. 11C. When the resist 107 is formed by photolithography in order to thus separate the control gate electrodes 106a, 106b, the cost of the device rises.

Accordingly, there is much to be desired in the art. In one aspect, there is a need to provide a semiconductor storage device and method of manufacturing same in which it is possible to lower cost by eliminating the step of forming a photolithographic resist.

According to a first aspect of the present disclosure, there is provided a semiconductor storage device having a split-gate non-volatile memory that comprises memory cells each having: first and second impurity regions formed in a substrate on both sides of a channel region; a select gate electrode formed on the channel region via a gate insulating film; and first and second control gate electrodes formed into a sidewall shape on both side faces of the select gate electrode and on the surface of the channel region via a gate-isolation insulating film. The memory cells are arrayed along row and column directions. The second impurity regions are arranged in such a manner that second impurity regions adjacent along the column direction are joined together, and are electrically connected to a common source line. The select gate electrode is arranged into a ring shape so as to surround the second impurity regions, and is electrically connected to a word line. The first control gate electrode is arranged into a ring shape on the outer peripheral side of the select gate electrode. The second control gate electrode is arranged into a ring shape on the inner peripheral side of the select gate electrode and on the outer peripheral side of the second impurity regions. The first impurity regions are placed on the outer peripheral side of the first control gate electrode and are arranged in such a manner that first impurity regions adjacent along the column direction are not joined together. First and second bit lines corresponding to every row are placed on the memory cells. The first bit line is electrically connected to one of first impurity regions that are adjacent along the row direction sandwiching the second impurity region between them. The second bit line is electrically connected to the other of the first impurity regions adjacent along the row direction sandwiching the second impurity region between them.

According to a second aspect, there is provided a method of manufacturing a semiconductor storage device having a split-type non-volatile memory. The method comprises: forming a select gate electrode on a channel region of a substrate via a gate insulating film; forming a gate-isolation insulating film on a surface of the substrate inclusive of the select gate electrode; and after a silicon layer is formed on the surface of the gate-isolation insulating film, forming sidewall-shaped first and second control gate electrodes by etching back the silicon layer. The method further comprises: forming first and second impurity regions on both sides of a channel region of the substrate in self-aligning fashion; and exposing surfaces of the select gate electrode and first and second impurity regions, by removing the gate-isolation insulating film on the select gate electrode and first and second impurity regions. At the forming the first and second impurity regions, the second impurity regions are formed in such a manner that second impurity regions adjacent along the column direction are joined together; and at the forming the select gate electrode, the select gate electrode is formed into a ring shape so as to surround an area in which the second impurity regions are formed.

In accordance with the present disclosure, the first and second control gate electrodes can be separated from each other without the use of a photolithographic resist by adopting the ring-shaped configuration for the select gate electrode for two columns of the cell array. This makes it possible to lower the cost of the device. It should be noted that although the amount of address information is halved by connecting the select gate electrode for two columns of the cell array to a single word line, the reduced amount of address information can be made up for by dividing the bit lines into two per row of the cell array.

Other features and advantages of the present disclosure will be apparent from the following description taken in conjunction with the accompanying drawings, in which like reference characters designate the same or similar parts throughout the figures thereof.

BRIEF DESCRIPTION OF THE DRAWINGS

FIGS. 2A and 2B are sectional views taken along lines X-X' and Y-Y', respectively, of FIG. 1 schematically illustrating the structure of a semiconductor storage device according to Example 1;

PREFERRED MODES

Figure 3:
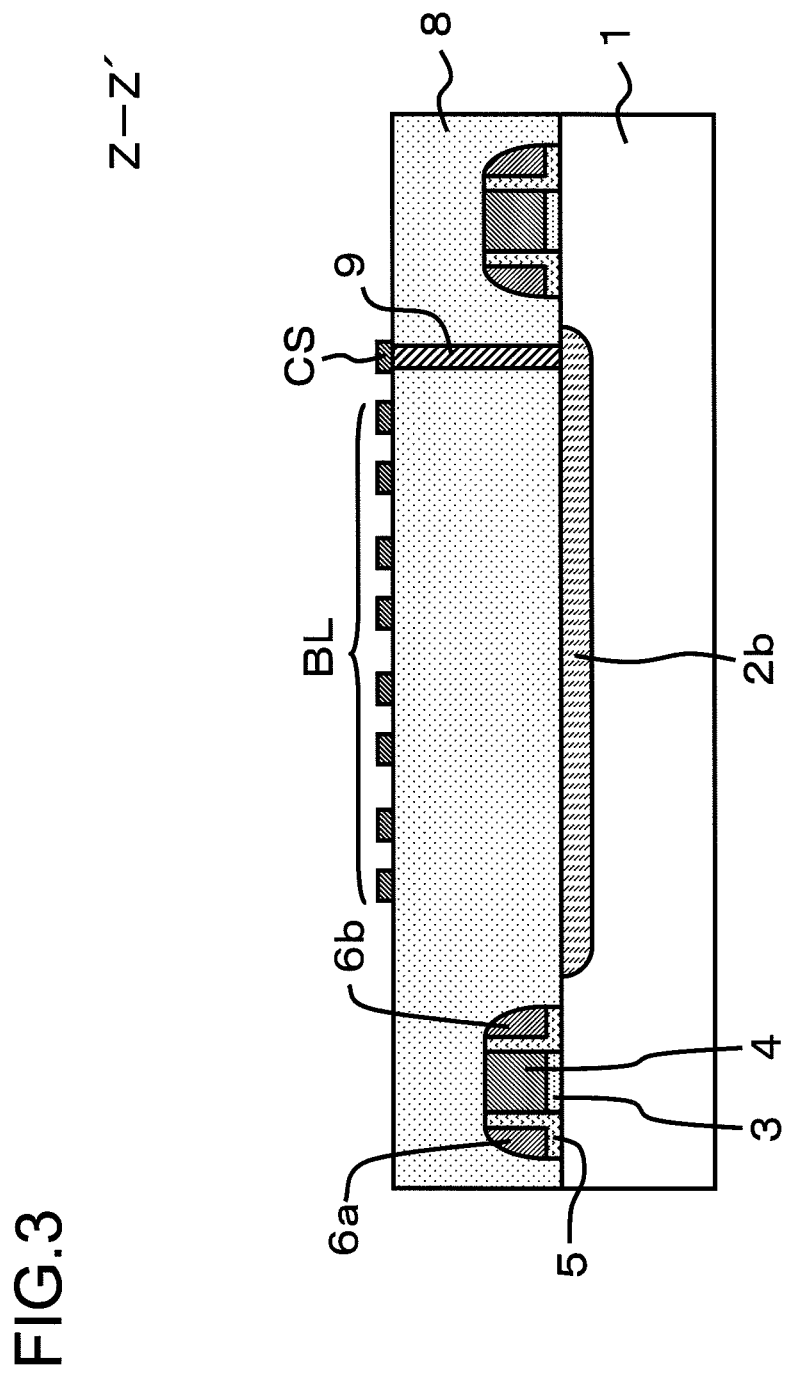
FIG. 3 is a sectional view taken along line Z-Z' of FIG. 1 schematically illustrating the structure of a semiconductor storage device according to Example 1.

A semiconductor storage device according to a first exemplary embodiment of the present disclosure comprises memory cells each having first and second impurity regions (2a, 2b in FIGS. 1 to 3) formed in a substrate (1 in FIGS. 2A, 2B and FIG. 3) on both sides of a channel region; a select gate electrode (4 in FIGS. 1 to 3) formed on the channel region via a gate insulating film (3 in FIGS. 2A, 2B and FIG. 3); and first and second control gate electrodes (6a, 6b in FIGS. 1 to 3) formed into a sidewall shape on both side faces of the select gate electrode (4 in FIGS. 1 to 3) and on the surface of the channel region(s) via a gate-isolation insulating film (5 in FIGS. 2A, 2B and FIG. 3). The memory cells are arrayed along row and column directions. The second impurity regions (2b in FIGS. 1 to 3) are arranged in such a manner that second impurity regions (2b in FIGS. 1 to 3) adjacent along the column direction are joined, and are electrically connected to a common source line (CS in FIG. 1). The select gate electrode (4 in FIGS. 1 to 3) is arranged into a ring shape so as to surround the second impurity region (2b in FIGS. 1 to 3), and is electrically connected to a word line (WL in FIG. 1). The first control gate electrode (6a in FIGS. 1 to 3) is arranged into a ring shape on the outer peripheral side of the select gate electrode (4 in FIGS. 1 to 3), and the second control gate electrode (6b in FIGS. 1 to 3) is arranged into a ring shape on the inner peripheral side of the select gate electrode (4 in FIGS. 1 to 3) and on the outer peripheral side of the second impurity regions (2b in FIGS. 1 to 3). The first impurity regions (2a in FIGS. 1 to 3) are placed on the outer peripheral side of the first control gate electrode (6a in FIGS. 1 to 3) and are arranged in such a manner that first impurity regions (2a in FIGS. 1 to 3) adjacent along the column direction are not joined each other. First and second bit lines (BL in FIGS. 1 to 3) corresponding to every row are placed on the memory cells, the first bit line (BL in FIGS. 1 to 3) is electrically connected to one of first impurity regions (2a in FIGS. 1 to 3) that are adjacent along the row direction sandwiching (interposed with) the second impurity region (2b in FIGS. 1 to 3) between them, and the second bit line (BL in FIGS. 1 to 3) is electrically connected to the other of the first impurity regions (2a in FIGS. 1 to 3) that are adjacent along the row direction sandwiching (interposed with) the second impurity region (2b in FIGS. 1 to 3) between them.

Figure 9A:
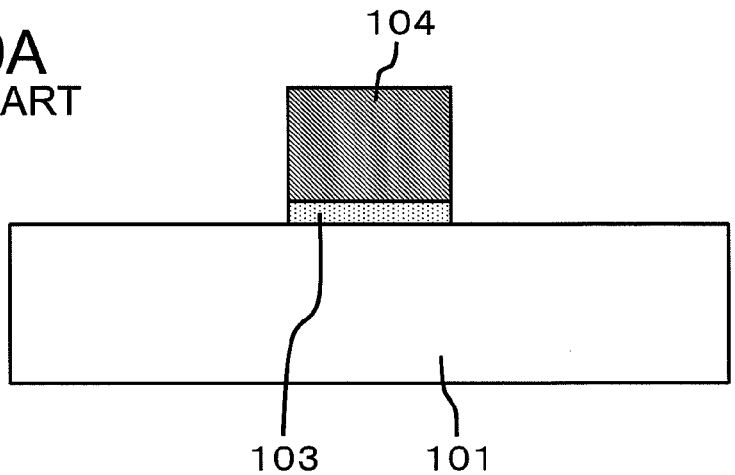
FIGS. 9A, 9B and 9C are partial plan views of a first process schematically illustrating a method of manufacturing a memory cell in semiconductor storage device according to the related art.
Figure 9B:
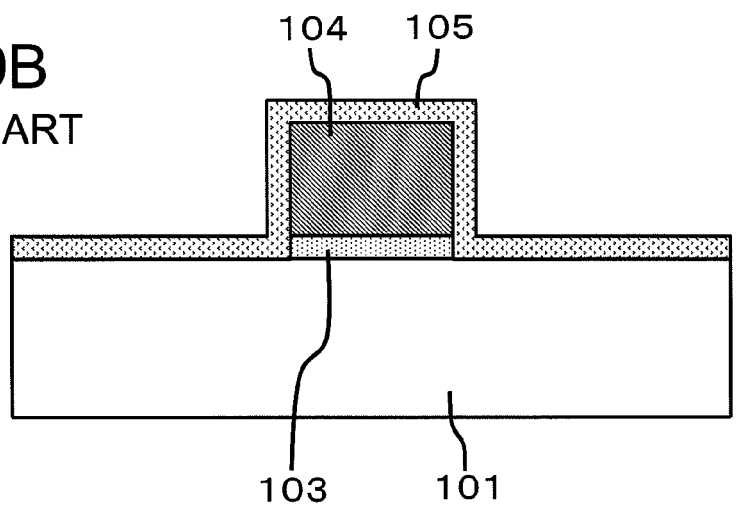
Figure 9C:
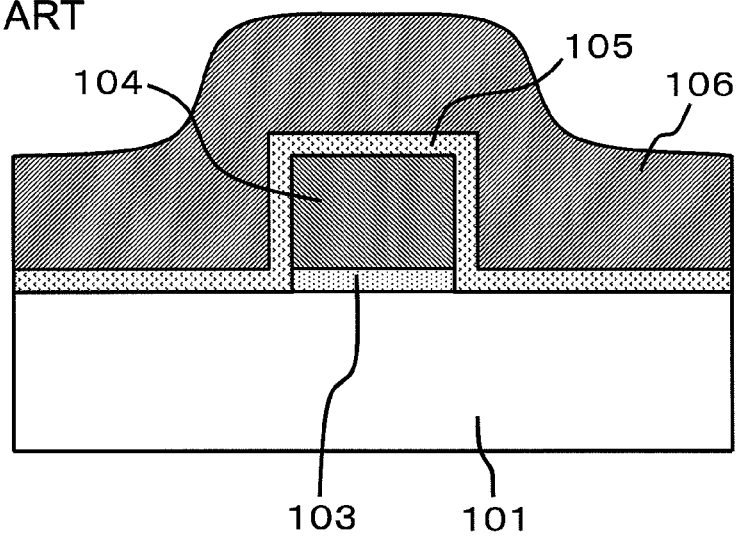
Figure 10A:
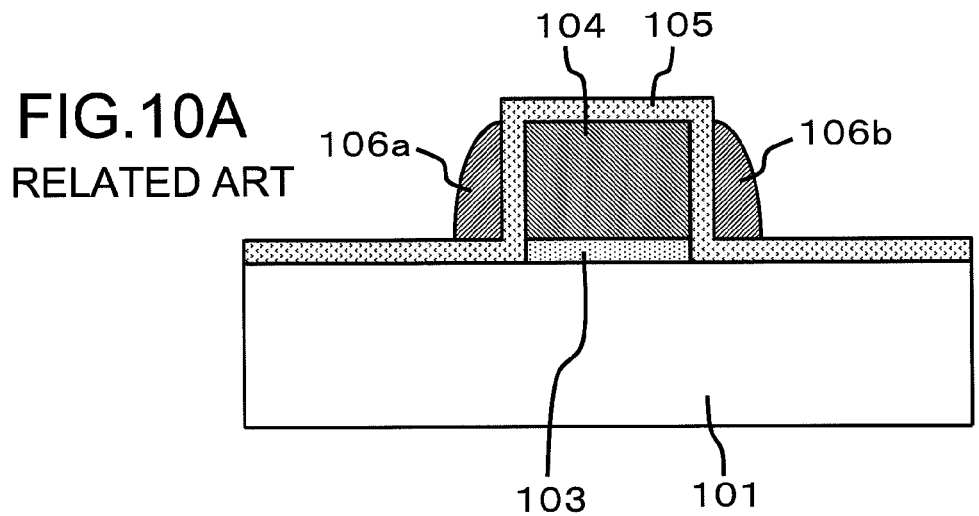
FIGS. 10A, 10B and 10C are partial plan views of a second process schematically illustrating a method of manufacturing a memory cell in semiconductor storage device according to the related art.
Figure 10B:
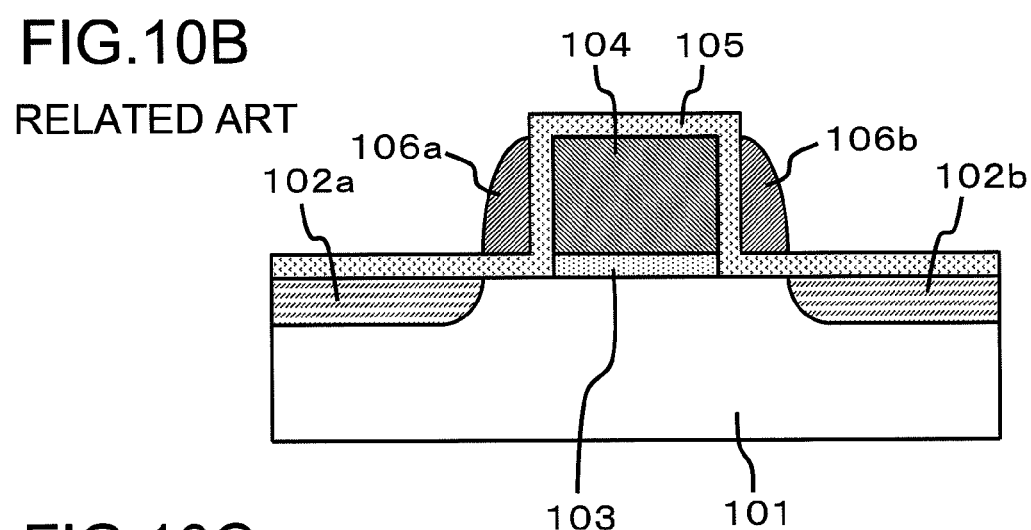
Figure 10C:
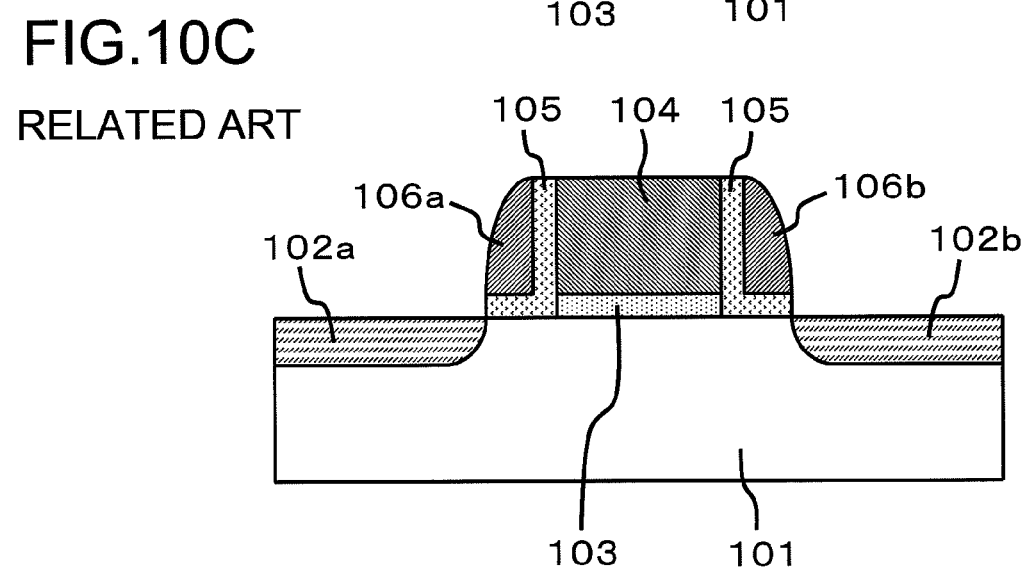
Figure 11A:
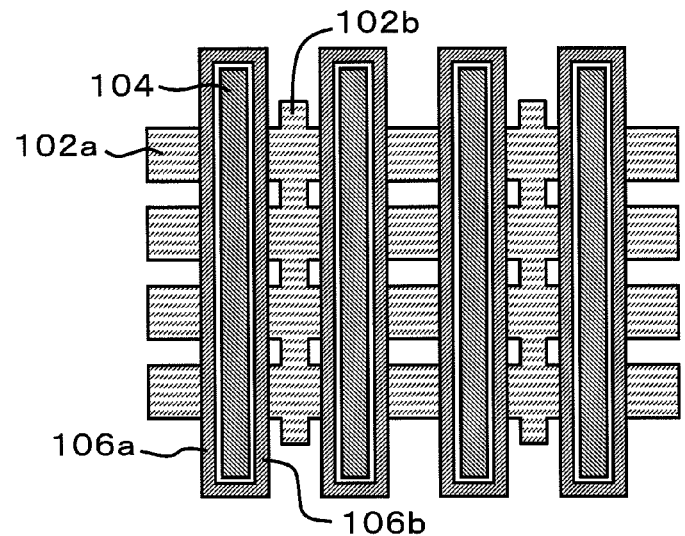
FIGS. 11A, 11B and 11C are partial plan views schematically illustrating a method of manufacturing a cell array in a semiconductor storage device according to the related art.
Figure 11B:
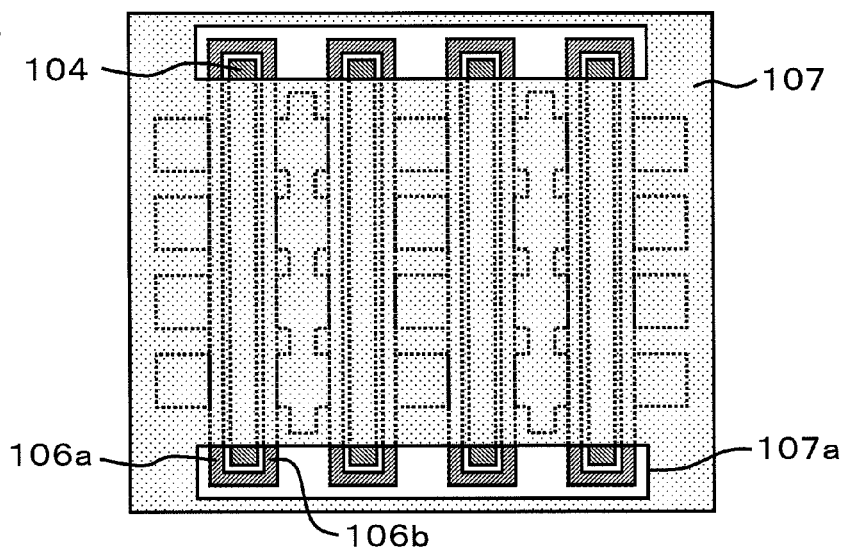
Figure 11C:
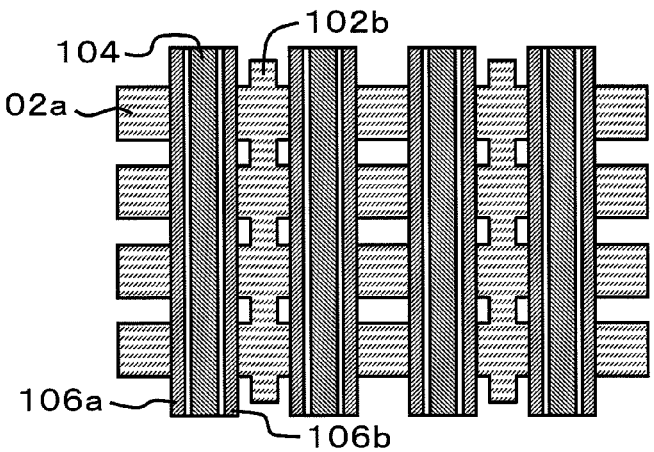

A method of manufacturing a semiconductor storage device according to a second exemplary embodiment comprises a series of steps: forming a select gate electrode on a channel region of a substrate via a gate insulating film (FIG. 9A); forming a gate-isolation insulating film on the surface of the substrate inclusive of the select gate electrode (FIG. 9B); after a silicon layer is formed on the surface of the gate-isolation insulating film (FIG. 9C), forming sidewall-shaped first and second control gate electrodes by etching back the silicon layer (FIG. 10A); forming first and second impurity regions on both sides of the channel region of the substrate in self-aligning fashion (FIG. 10B); and exposing surfaces of the select gate electrode and first and second impurity regions by removing the gate-isolation insulating film on the select gate electrode and first and second impurity regions (FIG. 10C). At the forming the first and second impurity regions, the second impurity regions are formed in such a manner that second impurity regions adjacent along the column direction are joined together (FIG. 6A), and at the forming the select gate electrode, the select gate electrode is formed into a ring shape so as to surround an area in which the second impurity regions are formed.

It should be noted that in a case where reference symbols for drawings are assigned in this application, these are solely for the purpose of aiding an understanding of the disclosure and are not intended to limit the disclosure to the illustrated modes.

In the present disclosure, there are various possible modes, which include:

Mode 1

Mode 1=as set forth as the first aspect.

Mode 2

In the device according to mode 1, the first control gate electrode may be electrically connected to ground wiring; and the second control gate electrode may be electrically connected to a wiring whose voltage is controlled.

Mode 3

Mode 3=as set forth as the second aspect.

Mode 4

In the method according to mode 3, after the exposing surfaces of the select gate electrode and first and second impurity regions, the method may further comprises: forming an interlayer insulating film on the substrate inclusive of the first and second impurity regions, select gate electrode and first and second control gates; forming holes, which communicate with the first and second impurity regions, select gate electrode and first and second control gate electrodes, in the interlayer insulating film at prescribed positions; embedding vias in the holes; and forming wiring, which includes bit lines and word lines, at prescribed positions on the interlayer insulating film inclusive of the vias.

Example 1

Figure 1:
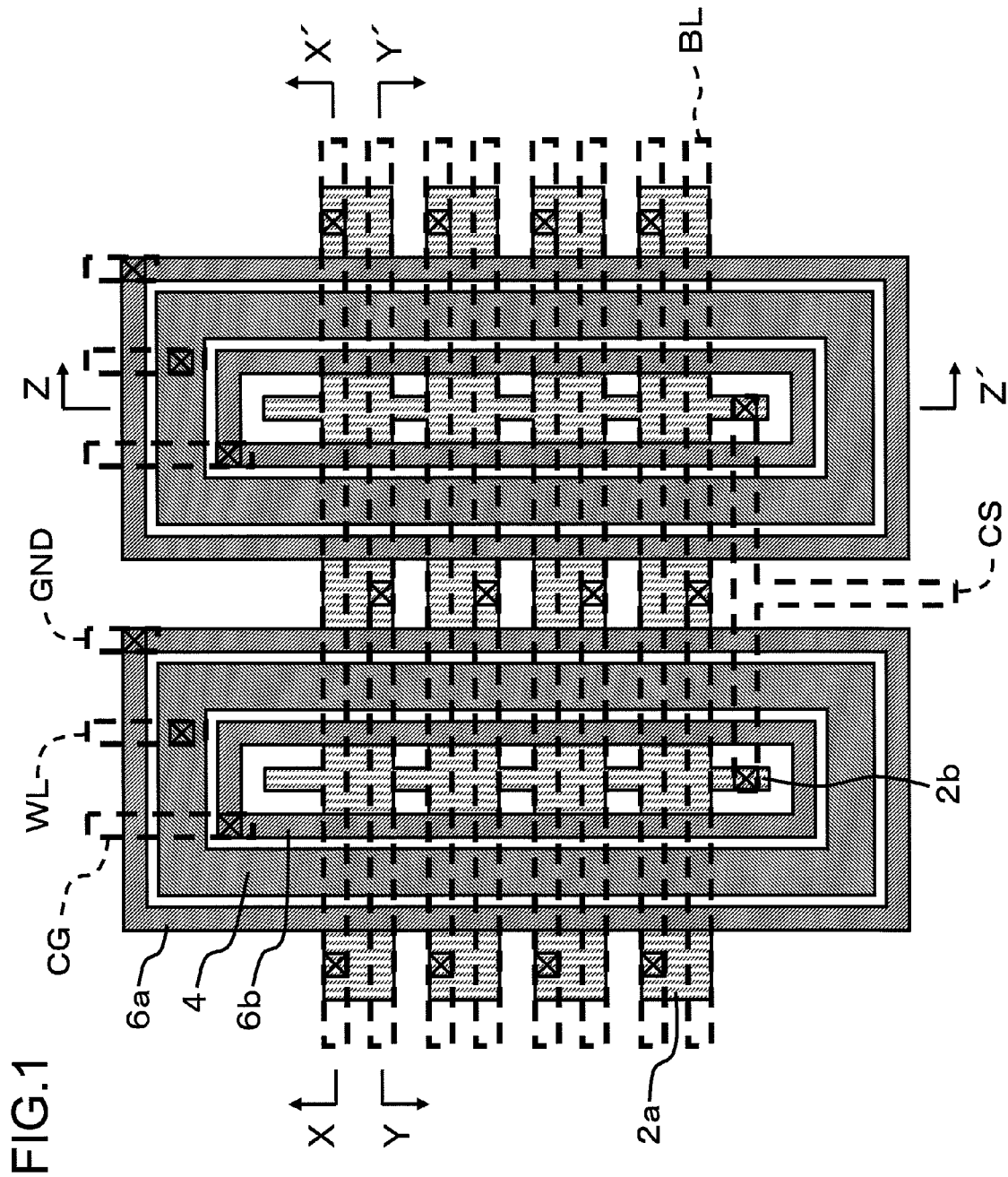
FIG. 1 is a partial plan view schematically illustrating the structure of a semiconductor storage device according to Example 1 of the present disclosure.
Figure 4:
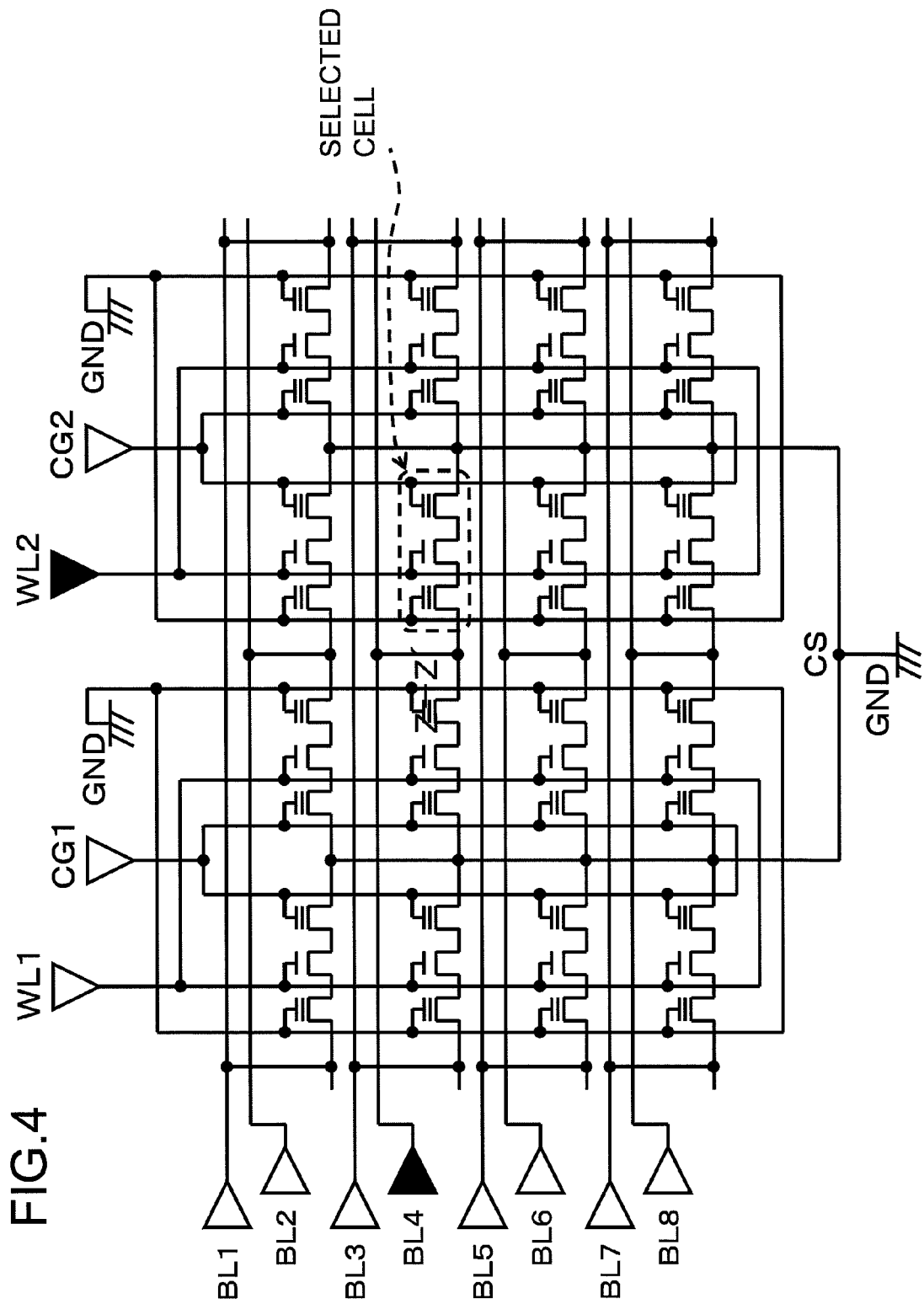
FIG. 4 is an equivalent circuit diagram schematically illustrating the structure of a semiconductor storage device according to the Example 1.

A semiconductor storage device according to Example 1 will now be described in detail. FIG. 1 is a partial plan view schematically illustrating the structure of a semiconductor storage device according to Example 1; FIGS. 2A and 2B are sectional views taken along lines X-X' and Y-Y', respectively, of FIG. 1 schematically illustrating the structure of a semiconductor storage device according to Example 1; FIG. 3 is a sectional view taken along line Z-Z' of FIG. 1 schematically illustrating the structure of a semiconductor storage device according to Example 1; and FIG. 4 is an equivalent circuit diagram schematically illustrating the structure of a semiconductor storage device according to Example 1.

Figure 7:
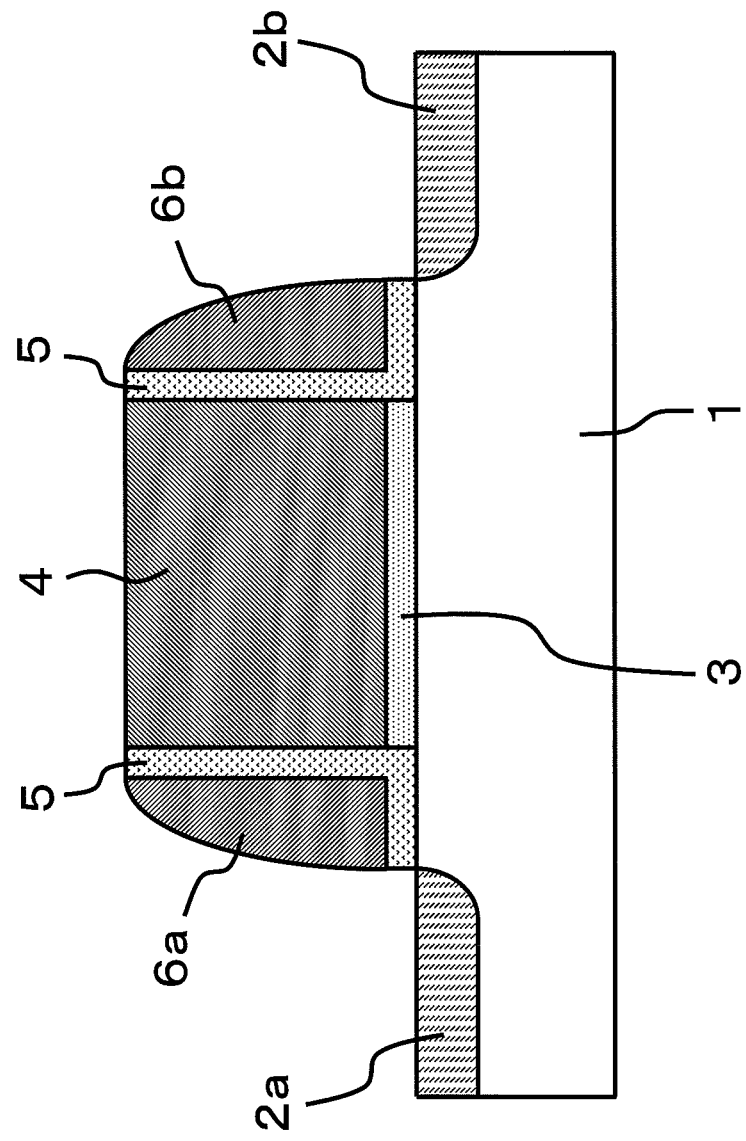
FIG. 7 is a partial sectional view schematically illustrating the structure of a memory cell in a semiconductor storage device according to the prior art.

With reference to FIGS. 1 to 4, the semiconductor storage device is a semiconductor storage device having a split-gate non-volatile memory. A pair of impurity regions 2a, 2b are formed in the main surface of a substrate 1 with a channel region sandwiched between them, a select gate electrode 4 is formed on the channel region via a gate insulating film 3, and sidewall-shaped control gate electrodes 6a, 6b are formed on both side faces of the select gate electrode 4 and on the surface of the channel region (the channel region in the area between the impurity regions 2a, 2b and select gate electrode 4) via a gate-isolation insulating film 5. Although the basic arrangement of the memory cells is similar to that of the related art (see FIG. 7), this cell array differs in terms of the planar shape of the select gate electrode 4 and first control gate electrodes 6a, 6b, the numbers of word lines (WL1, WL2) and bit lines (BL1 to BL8), and in the positions where the bit lines (BL1 to BL8) are connected to the first impurity regions 2a (namely the position of vias 9).

The substrate 1 is a silicon substrate the conductivity type of which is opposite that of the impurity regions 2a, 2b (see FIGS. 2A, 2B and FIG. 3).

The impurity region 2a is a source-drain region obtained by injecting into the substrate 1 an impurity of a conductivity type opposite that of the substrate 1 (see FIG. 1 and FIGS. 2A, 2B). The impurity region 2a is connected to a bit line driver (not shown) through a corresponding via 9 and a bit line (BL1 to BL8) (see FIG. 4). The impurity regions 2a are placed at the side of the first column of memory cells of the cell array (namely on the side devoid of adjacent memory cells), and at the mutually adjacent common portions of respective memory cells of second and third columns, fourth and fifth columns, . . . , 2nth and (2n+1)th columns (where n is a natural number) of the cell array, and at the side of the last column of memory cells of the cell array (namely on the side devoid of adjacent memory cells). Each of the impurity regions 2a is not joined to the other impurity regions 2a adjacent along the column direction.

The impurity region 2b is a source-drain region obtained by injecting into the substrate 1 an impurity of a conductivity type opposite that of the substrate 1 (see FIGS. 1 to 3). The impurity region 2b is connected to ground (ground wiring) through a corresponding via 9 and a common source line (CS) (see FIG. 4). The impurity regions 2b are placed at the mutually adjacent common portions of respective memory cells of first and second columns, third and fourth columns, . . . , (2m−1)th and 2mth columns (where m is a natural number) of the cell array. The impurity regions 2b are joined to (continuous or connected to) the other impurity regions 2a adjacent along the column direction.

The gate insulating film 3 is an insulating film such as a silicon oxide film (see FIGS. 2A, 2B and FIG. 3).

The select gate electrode 4 is an electrode for a select gate and comprises polysilicon or the like (see FIGS. 1 to 3). The select gate electrode 4 is joined to each of the select gate electrodes 4 of the memory cells along the column direction of the cell array, and is formed into a ring shape by connecting the select gate electrodes 4 together at both ends thereof in first and second columns, third and fourth columns, . . . , (2m−1)th and 2mth columns (where m is a natural number) of the cell array. By forming the select gate electrode 4 into the ring-shaped configuration, the control gate electrode 6a on the outer peripheral side of the select gate electrode 4 and the second control gate electrode 6b on the inner peripheral side can be separated from each other. The select gate electrode 4 is connected to a word line driver (not shown) through a corresponding via 9 and word line (WL1, WL2) (see FIG. 4).

The gate-isolation insulating film 5 is an insulating film which, in comparison with the gate insulating film 3, has a charge accumulating capability. By way of example, ONO film can be used for this film (see FIGS. 2A, 2B and FIG. 3).

The control gate electrode 6a is an electrode for a control gate and comprises polysilicon or the like (see FIGS. 1 to 3). The control gate electrode 6a is connected to ground (ground wiring) through a corresponding via 9 and wiring. The control gate electrode 6a in the memory cell is placed on that side of the select gate electrode 4 where the impurity region 2a is located. The control gate electrode 6a is joined to each of the control gate electrodes 6a of the memory cells along the column direction of the cell array, and is formed into a ring shape on the outer peripheral side of the select gate electrode 4 by connecting the control gate electrodes 6a together at both ends thereof in first and second columns, third and fourth columns, . . . , (2m−1)th and 2mth columns (where m is a natural number) of the cell array.

The control gate electrode 6b is an electrode for a control gate and comprises polysilicon or the like (see FIGS. 1 to 3). The control gate electrode 6b is connected to a control gate driver (not shown) through a corresponding via 9 and wiring (CG1, CG2) (see FIG. 4). The control gate electrode 6b in the memory cell is placed on that side of the select gate electrode 4 where the impurity region 2b in located. The control gate electrode 6b is joined to each of the control gate electrodes 6b of the memory cells along the column direction of the cell array, and is formed into a ring shape on the inner peripheral side of the select gate electrode 4 by connecting the control gate electrodes 6b together at both ends thereof in first and second columns, third and fourth columns, . . . , (2m−1)th and 2mth columns (where m is a natural number) of the cell array.

An interlayer insulating film 8 is an insulating film comprising silicon oxide or the like formed on the substrate 1 inclusive of the memory cells (see FIGS. 2A, 2B and FIG. 3). The interlayer insulating film 8 is formed at prescribed positions with holes that communicate with the impurity regions 2a, 2b, select gate electrodes 4 and control gate electrodes 6a, 6b, and the vias 9 are embedded within the holes. Various wiring traces such as the bit lines (BL1 to BL8), word lines (WL1, WL2) and common source lines (CS), which are electrically connected to corresponding vias 9, are formed on the interlayer insulating film 8.

The vias 9 are conductor portions comprising tungsten or the like embedded in the holes formed in the interlayer insulating film 8 (see FIGS. 1 to 3). The vias 9 electrically connect the structural portions of the memory cells underlying the interlayer insulating film 8 and the corresponding wiring on the interlayer insulating film 8.

Figure 8:
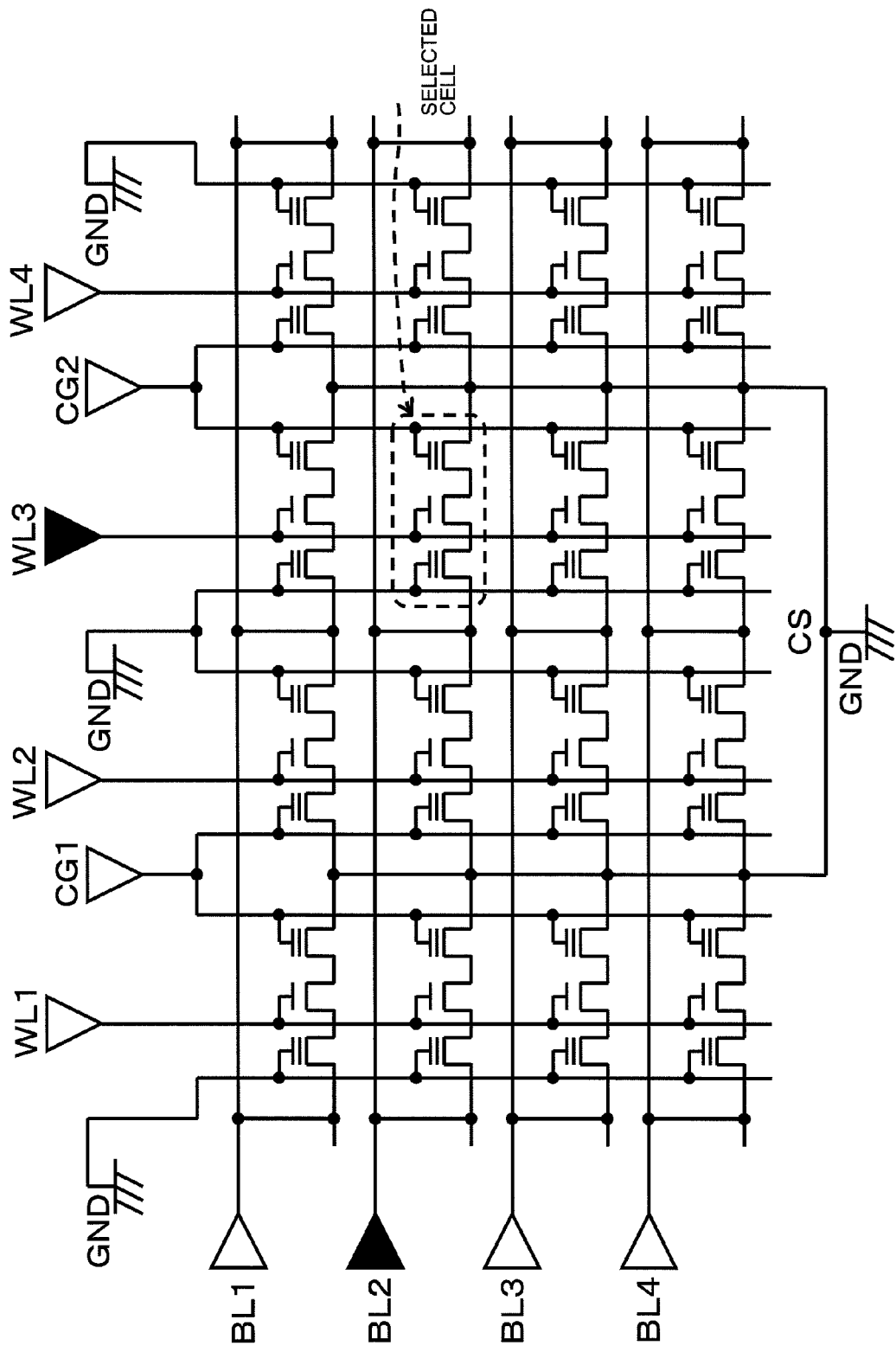
FIG. 8 is a circuit diagram schematically illustrating the structure of a cell array in a semiconductor storage device according to the related art.

The bit lines (BL; BL1 to BL8), which are wiring traces electrically connected to the impurity regions 2a of the corresponding memory cells through the vias 9, extend along the row direction on the interlayer insulating film 8 (see FIGS. 1 to 4). The bit lines (BL; BL1 to BL8) are such that two bit lines correspond to the memory cells in one row thereof; this differs from the related art (where there is one bit line for the memory cells in one row, as illustrated in FIG. 8). For example, with regard to the memory cells in the first row, the bit line BL1 is electrically connected to the impurity region 2a in the first column, to the common impurity regions 2a of the memory cells in the fourth and fifth columns, and to the common impurity regions 2a of the memory cells in the (4n−4)th and (4n−3)th columns (where n is a natural number). The bit line BL2 is electrically connected to the common impurity regions 2a of the memory cells in the second and third columns and to the common impurity regions 2a of the memory cells in the (4m−2)th and (4m−1)th columns (where m is a natural number). In other words, the bit lines BL1 and BL2 are electrically connected in alternating fashion to the alternately disposed impurity regions 2a in such a manner that they are not electrically connected to the same impurity region 2a. With regard also to the bit lines (BL3 to BL8) involved with the memory cells in the other rows, these have connection patterns similar to those of the bit lines (BL1, BL2) relating to the memory cells in the first row.

The word lines (WL; WL1, WL2), which are wiring traces electrically connected to the select gate electrodes 4 of the corresponding memory cells through the vias 9, are formed on the interlayer insulating film 8 (see FIGS. 1 to 4). The word lines (WL; WL1, WL2) are such that one word line corresponds to the memory cells in two columns; this differs from the related art (where there is one word line per one column of memory cells, as illustrated in FIG. 8). For example, the word line WL1 is electrically connected to the common select gate electrodes 4 regarding the memory cells in the first and second columns. With regard also to the word lines (WL2 . . . ) involved with the memory cells in the other column(s), these have connection patterns similar to those of the word line (WL1).

The common source line (CS) is electrically connected through the vias 9 to the impurity regions 2b of each of the memory cells irrespective of row and column directions. The common source line (CS) is electrically connected to the mutually adjacent common impurity regions 2b of respective memory cells of first and second columns, third and fourth columns, . . . , (2m−1)th and 2mth columns (where m is a natural number) of the cell array.

It should be noted that FIGS. 1 to 4 illustrate an example of a cell array in which the memory cells are arrayed in four rows and four columns for the sake of explanation. However, the present disclosure is not limited to this arrangement. Further, the number of bit lines BL is doubled in comparison with the number of bit lines BL (generally one hundred and several tens of bit lines) in the prior art. However, since the number of word lines WL is halved in comparison with the number of word lines WL (generally several thousand word lines) in the related art, the structure of the peripheral circuitry of the semiconductor storage device can be reduced in size overall.

If a cell in this semiconductor storage device is selected by supplying the select gate electrode 4 with a prescribed potential, then controlling the potential supplied to the impurity regions 2a, 2b and control gate electrodes 6a, 6b enables electric charge to be stored in and written to the gate-isolation insulating film 5 underlying the control gate electrodes 6a, 6b, to be read out and to be discharged and erased from the gate-isolation insulating film 5. Further, by way of example, in order to select the selected cell enclosed by the dotted line in FIG. 4, the bit line BL4 and word line WL2 are selected by the bit line driver (not shown) and word line driver (not shown), respectively.

Next, a method of manufacturing a semiconductor storage device according to this embodiment will be described with reference to the drawings. FIGS. 5A and 5B and FIGS. 6A and 6B are partial plan views of process steps schematically illustrating a method of manufacturing a semiconductor storage device according to this example.

Figure 5A:
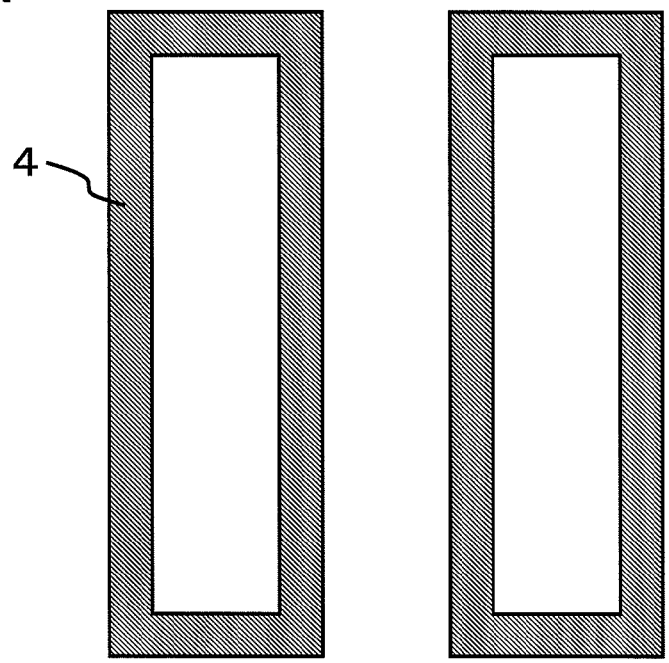
FIGS. 5A and 5B are partial plan views of a first process schematically illustrating a method of manufacturing a semiconductor storage device according to Example 1.

First, an insulating film that will become the gate insulating film 3 is formed on the substrate 1, a silicon layer that will become the select gate electrode 4 is formed on the insulating film, a resist that covers the portion left as the select gate electrode 4 is formed on the silicon layer, and then the polysilicon and insulating film are etched using the resist as a mask, thereby forming the gate insulating film 3 and select gate electrode 4 on the substrate 1. The resist is removed subsequently. At this time the select gate electrode 4 is formed into a ring-shaped configuration in a plane, as illustrated in FIG. 5A. This is true also for the gate insulating film 3. The cross-sectional shape at this time is similar to that shown in FIG. 9A.

Next, the gate-isolation insulating film 5 is formed on the surface of the substrate 1 inclusive of the select gate electrode 4. The cross-sectional shape at this time is similar to that shown in FIG. 9B.

Next, a silicon layer for the control gate electrodes 6a, 6b is formed on the surface of the gate-isolation insulating film 5. The cross-sectional shape at this time is similar to that shown in FIG. 9C.

Figure 5B:
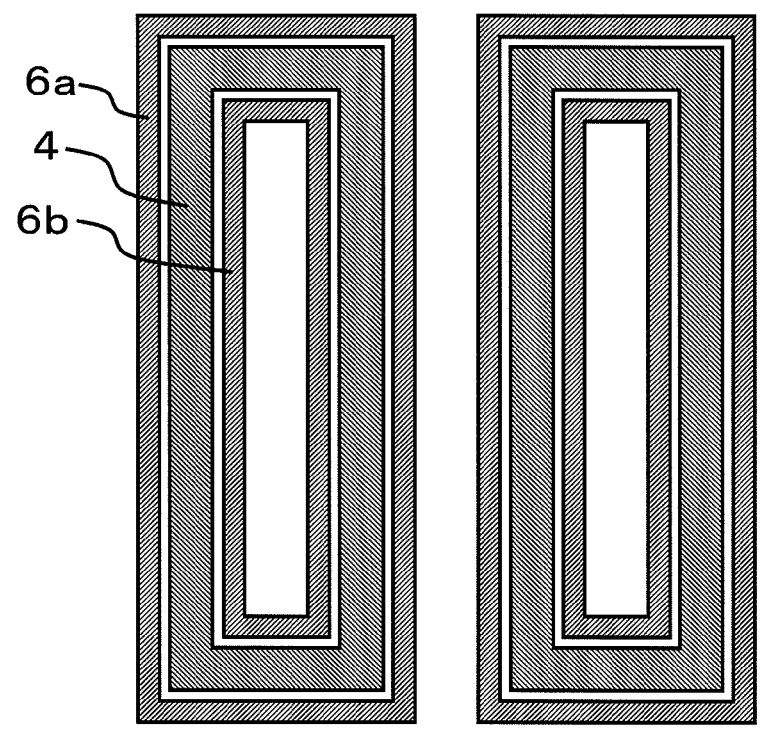

Next, the sidewall-shaped control gate electrodes 6a, 6b are formed by etching back the silicon layer (by anisotropic etching). At this time the control gate electrodes 6a, 6b are formed planarly into a ring shape along the side walls on the outer and inner peripheral sides of the select gate electrode 4, as illustrated in FIG. 5B, and thus a state is obtained in which the control gate electrodes 6a, 6b are separated from each other. The cross-sectional shape at this time is similar to that shown in FIG. 10A.

Next, a resist having openings in areas that will become the impurity regions 2a, 2b is formed on the substrate 1 inclusive of the select gate electrode 4 and control gate electrodes 6a, 6b, and an impurity is injected into the substrate 1 using a resist as a mask, thereby forming a pair of impurity regions 2a, 2b on both sides of the channel region of substrate 1 in self-aligning fashion. The cross-sectional shape at this time is similar to that shown in FIG. 10B.

Figure 6A:
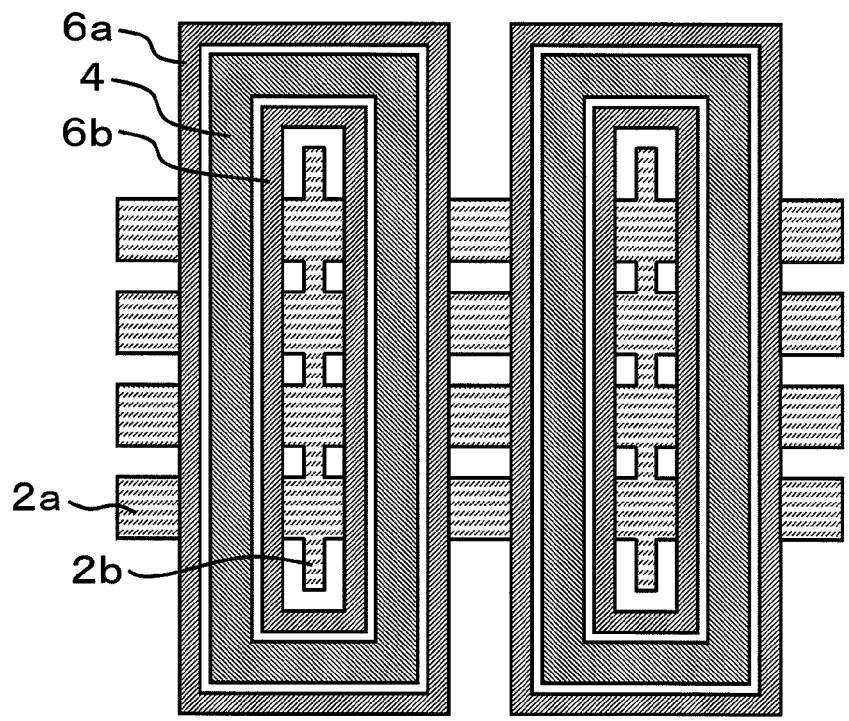
FIGS. 6A and 6B are partial plan views of a second process schematically illustrating a method of manufacturing a semiconductor storage device according to Example 1.

Next, the surfaces of the select gate electrode 104 and impurity regions 2a, 2b are exposed by selectively removing the gate-isolation insulating film 5 on the select gate electrode 4 and impurity regions 2a, 2b. The planar shape at this time is as shown in FIG. 6A and the cross-sectional shape is similar to that shown in FIG. 10C.

Next, the interlayer insulating film 8 is formed on the substrate 1 inclusive of the impurity regions 2a, 2b, select gate electrode 4 and control gate electrodes 6a, 6b, a resist having openings in areas where the vias 9 will be formed is formed on the interlayer insulating film 8 and the holes for the vias 9 are formed using the resist as a mask.

Figure 6B:
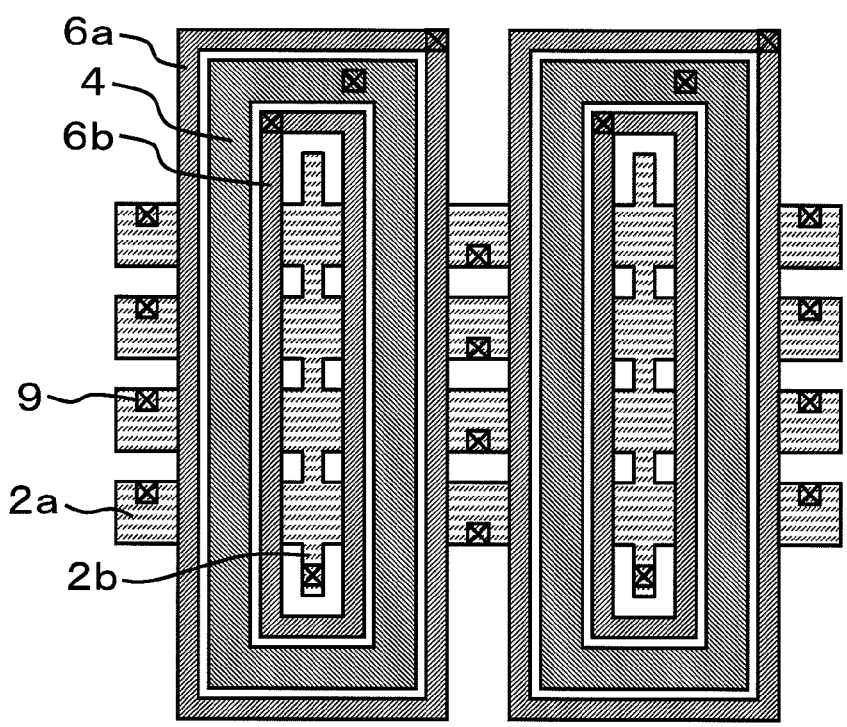

Next, the vias 9 are embedded in the holes in the interlayer insulating film 8. The planar shape at this time is as shown in FIG. 6B.

Finally, wiring such as the bit lines BL and word lines WL is formed on the interlayer insulating film 8 inclusive of the vias 9, thereby completing a semiconductor storage device similar to that shown in FIGS. 1 to 3.

In accordance with this example, the control gate electrodes 6a, 6b can be separated from each other without the use of a photolithographic resist by adopting the ring-shaped configuration for the select gate electrode 4 for two columns of the cell array. This makes it possible to lower the cost of the device. It should be noted that although the amount of address information is halved by connecting the select gate electrode 4 for two columns of the cell array to a single word line WL, the reduced amount of address information can be made up for by dividing the bit lines BL into two per row of the cell array.

As many apparently widely different embodiments of the present disclosure can be made without departing from the spirit and scope thereof, it is to be understood that the invention is not limited to the specific embodiments thereof except as defined in the appended claims.

It should be noted that other objects, features and aspects of the present disclosure will become apparent in the entire disclosure and that modifications may be done without departing the gist and scope of the present disclosure as disclosed herein and claimed as appended herewith.

Also it should be noted that any combination of the disclosed and/or claimed elements, matters and/or items may fall under the modifications aforementioned.

What is claimed is:

1. A method of manufacturing a semiconductor storage device comprising:
   forming a select gate electrode on a channel region of a substrate via a gate insulating film;
   forming a gate-isolation insulating film on a surface of a substrate inclusive of the select gate electrode;
   after a silicon layer is formed on the surface of the gate-isolation insulating film, forming sidewall-shaped first and second control gate electrodes by etching back the silicon layer;
   forming first and second impurity regions on both sides of a channel region of the substrate in self-aligning fashion; and
   exposing surfaces of the select gate electrode and first and second impurity regions by removing the gate-isolation insulating film on the select gate electrode and first and second impurity regions;
   wherein at said forming the first and second impurity regions, the second impurity regions are formed in such a manner that second impurity regions adjacent along the column direction are joined together; and
   at said forming the select gate electrode, the select gate electrode is formed into a ring shape so as to surround an area in which the second impurity regions are formed.

2. The method according to claim 1, after said exposing surfaces of the select gate electrode and first and second impurity regions, further comprising:
   forming an interlayer insulating film on the substrate inclusive of the first and second impurity regions, select gate electrode and first and second control gates;
   forming holes, which communicate with the first and second impurity regions, select gate electrode and first and second control gate electrodes, in the interlayer insulating film at prescribed positions;
   embedding vias in the holes; and
   forming wiring, which includes bit lines and word lines, at prescribed positions on the interlayer insulating film inclusive of the vias.

* * * * *